United States Patent
Cha et al.

(10) Patent No.: US 6,519,020 B1
(45) Date of Patent: Feb. 11, 2003

(54) LIQUID CRYSTAL DISPLAY MODULE, USING A FLEXIBLE PRINTED CIRCUIT BOARD WITH ENHANCED THERMOCOMPRESSION CHARACTERISTICS

(75) Inventors: Ki-Seok Cha, Sungnam (KR); Myung-Chul Kim, Seoul (KR); Won-Seok Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/357,884

(22) Filed: Jul. 21, 1999

(30) Foreign Application Priority Data

Jul. 29, 1998 (KR) ............................................. 98-30505

(51) Int. Cl.⁷ ............................................. G02F 1/1345
(52) U.S. Cl. ........................ 349/150; 349/149; 349/152
(58) Field of Search ................................. 349/149, 150, 349/152

(56) References Cited

U.S. PATENT DOCUMENTS 5,640,216 A * 6/1997 Hasegawa et al. ............ 349/58
5,680,183 A * 10/1997 Sasuga et al. ................. 349/58

\* cited by examiner

*Primary Examiner*—Toan Ton
*Assistant Examiner*—Andrew Schechter
(74) *Attorney, Agent, or Firm*—Hae-Chan Park; McGuireWoods LLP

(57) ABSTRACT

An LCD module uses a flexible printed circuit (FPC) instead of a gate or a source drive printed circuit board (PCB) so that size of area by which a tape carrier package (TCP) is thermocompression molded can be substantially decreased and thus reducing a difference in the degree of thermal expansion between PCB and TCP. As a result, a slim and lightweight LCD module can be obtained, and a misalignment or a warpage of TCP can be prevented.

7 Claims, 6 Drawing Sheets

LIQUID CRYSTAL DISPLAY MODULE, USING A FLEXIBLE PRINTED CIRCUIT BOARD WITH ENHANCED THERMOCOMPRESSION CHARACTERISTICS

BACKGROUND OF THE INVENTION

1. Field of the Invention

The present invention relates to a liquid crystal display (LCD) module, and more particularly to an LCD module employing a flexible printed circuit (FPC) instead of a gate or source driver printed circuit board (PCB). Portion of the PCB or FPC corresponding to the respective thermocompression bonded tape carrier packages (TCP) is substantially decreased to reduce the thermal expansion difference between PCB and TCP.

2. Description of the Related Art

Recently, an LCD as a data display device is gaining its importance as the information display device becomes smaller and lighter.

A cathode ray tube (CRT) that has been most widely used has lots of advantages in terms of function or price. However, there still exists a problem of size or portability. An LCD has an advantage in size, weight, and power consumption and is now rapidly replacing the CRT.

In a general LCD module, input electrode patterns of gate drive TCPs are connected correspondingly to the connector pads of a gate drive PCB while output electrode patterns are connected correspondingly to the pads for connecting a gate line of an LCD panel. In addition, input electrode patterns of source drive TCPs are connected correspondingly to the connector pads of a source drive PCB while output electrode patterns are connected correspondingly to the pads for connecting a data line of an LCD panel.

A gate drive PCB and a source drive PCB are electrically connected by an FPC so as to accomplish a rapid signal transmission.

However, in a conventional art, the gate portion and the source portion are both made of an PCB, which causes some problems.

First, the side portion of the LCD module becomes thick. As a result, the weight of the LCD module increases. This is against the tendency toward a slim device.

Moreover, a device for connecting the source portion and the gate portion is needed which complicates the assembly and increases manufacturing costs. That is, the gate drive PCB and the source drive PCB are respectively connected to the pads for connecting a gate line of an LCD panel and to the pads for connecting a data line of an LCD panel, and are interconnected by an FPC. For example, an FPC is soldered to a gate drive PCB, and is connected to a source drive PCB by being inserted into a terminal block fixed onto the source drive PCB. Thus, additional processes for the soldering and inserting into the terminal block are required. In addition, an FPC for connection is needed, thus increasing manufacturing costs.

Meanwhile, the gate drive PCB and the source drive PCB are respectively connected to the pads for connecting a gate line and to the pads for connecting a data line of an LCD panel, by inserting TCP. As is widely known, a driving IC is mounted onto the TCP. In a conventional LCD panel, the connector pads and TCP are connected by a thermocompression bonding method employing an anisotropic conductive film while PCB and TCP are connected by soldering.

However, as the number of input pins of the driving IC increases and TCP size decreases, a pin pad pitch is required to be decreased. If PCB and TCP are connected by soldering in such a structure, a short may occur between the adjacent pins.

Recently, thermocompression bonding at a high temperature is employed for a connection between PCB and TCP. However, a misalignment or a warpage of TCP may be caused due to a difference between the coefficients of the heat expansions of PCB and TCP. As a result, product's reliability with respect to assembly, vibration or impact may be harmed. This problem becomes worse when the PCB size increases as the screen size becomes larger and when the PCB becomes thin as the LCD module becomes slim. To overcome these problems, there has been proposed a structure where two PCBs are interconnected. However, an additional connector is required for a signal transmission. Such an increase in the number of PCBs causes a more complicated manufacturing process and higher costs.

SUMMARY OF THE INVENTION

It is therefore an object of the present invention to provide a slim and lightweight LCD module.

It is another object of the present invention to provide an LCD module with less number of manufacturing processes, lower costs and a simplified assembly process.

It is still another object of the present invention to provide an LCD module in which any misalign or a warpage of TCP may not occur when TCP and PCB are thermocompression bonded so as to be interconnected.

In accordance with an aspect of the present invention, a source drive portion facing either of the neighboring edges in a lower portion of the LCD panel is connected to a lower panel by a TCP on which a source driving integrated circuit (IC) is mounted. A gate drive portion facing another edge is connected to the lower portion of the LCD panel by a TCP on which a gate driving IC is mounted and is electrically connected to the source drive portion. One of the source or gate drive portions is made up of FPC while the other is made up of PCB.

TCP connector pads are respectively disposed by a predetermined space along the edges to which the gate and source drive portions face, and the source and gate drive portions are interconnected by an FPC connector portion formed integrally with either of the source and gate drive portions.

For example, an FPC connector pad is formed at an end portion of the FPC connector portion, and can be connected to PCB by a conductive adhesive. In addition, the FPC connector pad is inserted into a terminal block of the PCB so as to be connected to the other side of the PCB.

Preferably, electronic components generating an electrical signal for the gate driving IC are mounted to one of the source drive portion or the gate drive portion that is made up of PCB.

In accordance with another aspect of the present invention, there is provided an LCD module including an LCD panel, and a gate-source integrated type drive FPC facing the neighboring edges of the lower portion of the LCD panel and where a source drive portion connected to the lower portion of the LCD panel by a TCP on which a source driving IC is mounted and a gate drive portion connected to the lower portion of the LCD panel by a TCP on which a gate driving IC is mounted, are integrally formed.

Here, the electronic components generating an electrical signal to be applied to the gate and source driving IC are directly mounted to the gate and source drive portions of the gate-source integrated type drive FPC. Preferably, such electronic components can be mounted by a flip-chip bonding.

In accordance with yet another aspect of the present invention, an LCD module of the present invention includes a source drive FPC which faces either of the neighboring edges in the lower portion of the LCD panel and is connected to the lower portion of the LCD panel by a TCP on which a source driving IC is mounted, and a gate drive FPC which faces the other edge of the neighboring edges and is connected to the lower portion of the LCD panel by a TCP on which a gate driving IC is mounted. The source and gate drive FPCs are respectively connected to the graphic interface devices having electronic components for generating the electrical signal applied to the source and gate driving ICs.

For example, the source and gate drive FPCs are connected to the graphic interface device by a conductive adhesive, or are inserted into the terminal block of the graphic interface device so as to be connected to the graphic interface device.

In accordance with further another aspect of the present invention, an LCD module of the present invention includes a source drive portion that faces either of the neighboring edges in the lower portion of the LCD panel and is connected to the lower portion of the LCD panel by a TCP on which a source driving IC is mounted, and a gate drive portion that faces the other edge of the neighboring edges and is connected to the lower portion of the LCD panel by a TCP on which a gate driving IC is mounted and is electrically connected to the source drive portion. The TCPs are connected to the source and gate drive portions by a thermocompression bonding. At least one means for substantially decreasing the size of the area by which the TCPs are attached to the source and gate drive portions, is formed in the source and gate drive portions.

A separating slot formed at edges of the source and gate drive portions that face the lower portion of the LCD panel can be used as such means for decreasing the size of the area.

Preferably, length of the separating slot is longer than that of the area by which the TCP is attached to the drive portions. In addition, the separating slots are more likely formed densely at the edges of the source and gate drive portions rather than at the center.

As an embodiment of the present invention, there is provided an LCD module including: an LCD panel having an upper panel and a lower panel that is attached to the upper panel by filling a liquid crystal between the upper and lower panels; a source drive portion that faces either of the neighboring edges of the lower panel, and is connected to the lower panel by a first connector portion having a source driving IC and that is formed integrally with the source drive portion; and a gate drive portion that faces the other edge of the lower panel, and is connected to the lower panel by a second connector portion having a gate driving IC and that is formed integrally with the gate drive portion, and is electrically connected to the source drive portion. Either of the source or gate drive portion is made up of FPC.

For example, the source and gate drive portions are formed integrally with each other. Preferably, the first and second connector portions are separated into driving IC units by the respective separating slots.

BRIEF DESCRIPTION OF THE DRAWINGS

The above object and other advantages of the present invention will become more apparent by describing in detail the preferred embodiments thereof with reference to the accompanying drawings, in which.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those having skills in the art.

Figure 1:
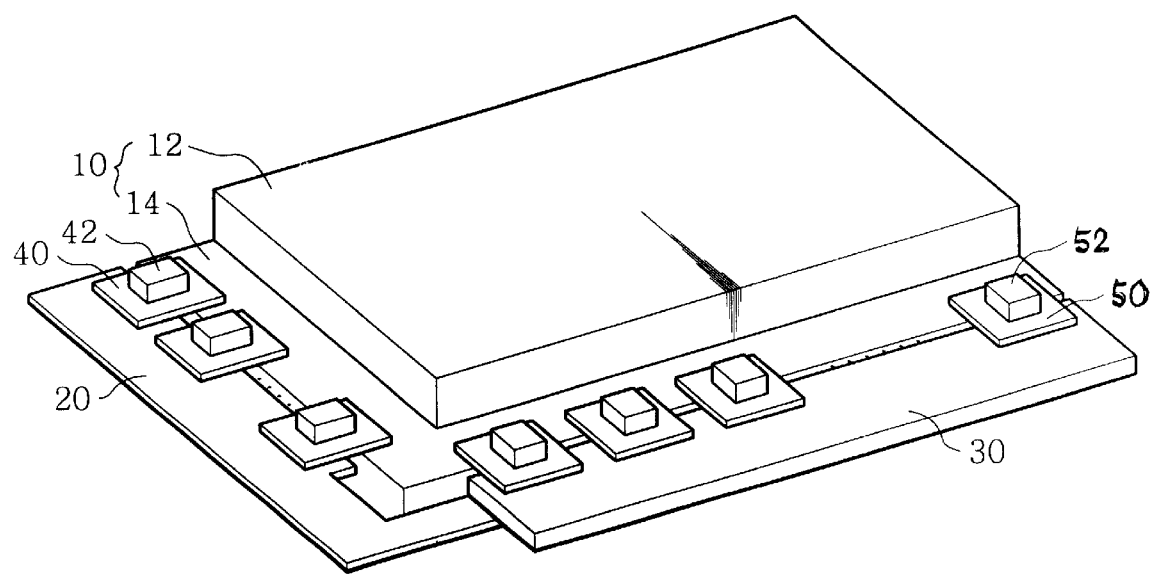
FIG. 1 is a perspective view of an LCD module according to embodiment 1 of the present invention.

Referring to FIG. 1, an LCD panel 10 includes an upper panel 12 and a lower panel 14 attached together with liquid crystal filled there between. Pads (not shown) for connecting a gate line and a data line are respectively formed at the neighboring edges of the lower panel 14.

Output electrode patterns of a TCP 50 are connected to the pad for connecting a data line, while input electrode patterns of the TCP 50 are connected to a source drive PCB 30.

In the present invention, output electrode patterns of a TCP 40 are connected to the pad for connecting a gate line while input electrode patterns of the TCP 40 are connected to a gate drive FPC 20.

Figure 2:
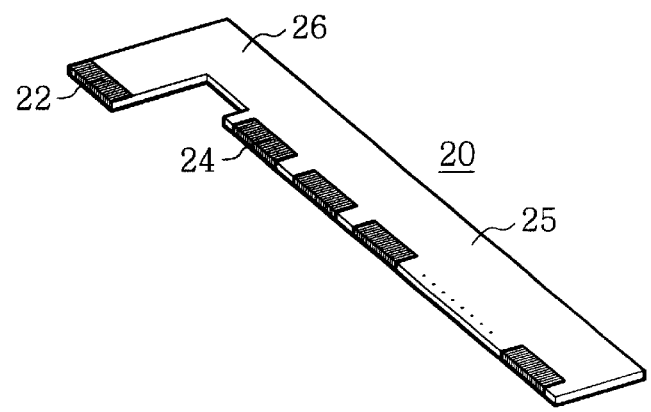
FIG. 2 is a perspective view of the gate drive FPC shown in FIG. 1.

Referring to FIG. 2, the gate drive FPC 20 includes a main body 25 and a connector portion 26 that is integrally formed in the main body 25, as a single layer. Pads 24 for connecting a gate drive IC are formed by a predetermined space along the edge of the main body 25 that faces the LCD panel, and pads 22 for connecting a source PCB is formed at an end portion of the connector portion 26.

Reference numerals 42 and 52 respectively denote a gate drive IC and a source drive IC.

Referring again to FIG. 1, output electrode patterns of the TCPs 40 and 50 are respectively connected to the pads for connecting the gate and data lines by a thermocompression bonding while input electrode patterns are respectively connected to the gate drive FPC 20 and the source drive PCB 30 by a thermocompression bonding.

In addition, the gate drive FPC 20 is connected to the source drive PCB 30 via the pad 22. At this time, the pad 22 is fixed onto the source drive PCB 30 by a conductive adhesive or is inserted to a terminal block which is mounted to the source drive PCB 30.

Meanwhile, all the components mounted on the gate drive FPC 20 can be mounted onto the source drive PCB 30, or can be directly mounted onto the gate drive FPC 20 by a flip-chip bonding method, which will be described later.

In the LCD module so structured, the gate drive FPC is used to reduce the thickness and the weight.

In addition, the source drive PCB can be formed integrally with the gate drive FPC, thus eliminating the necessity of additional connector. As a result, manufacturing process can be simplified while reducing the cost.

Although the embodiment of the present invention uses the gate drive FPC instead of the gate drive PCB, it would be also allowable to use the source drive PCB instead of the source drive FPC.

Figure 3:
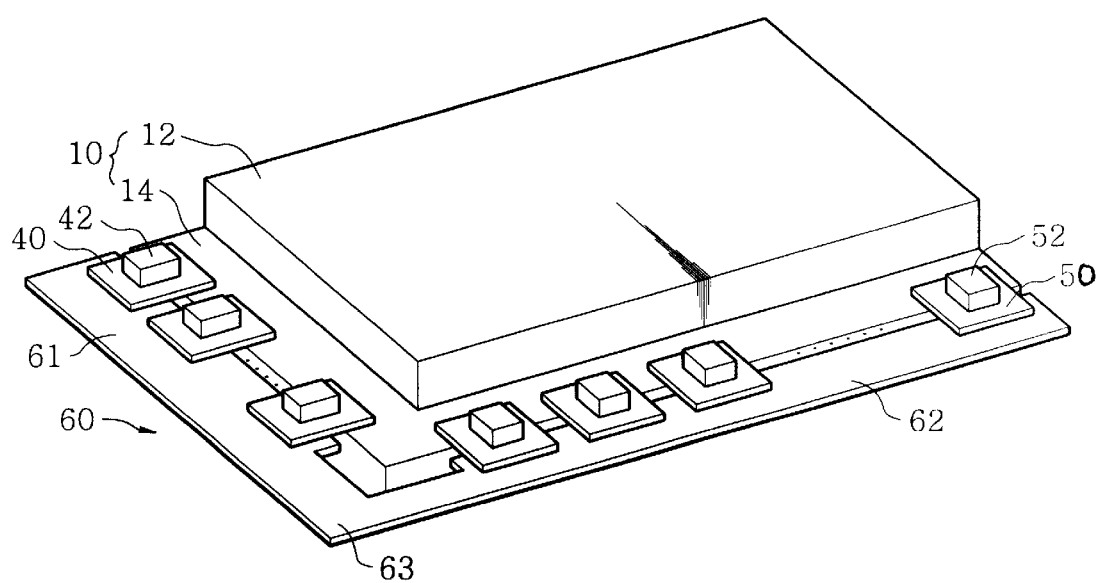
FIG. 3 is a perspective view of an LCD module according to embodiment 2 of the present invention.

Referring to FIG. 3, the LCD panel 10 includes the upper panel 12 and the lower panel 14 that is attached to the upper panel 12 by filling a liquid crystal between the upper panel 12 and lower panel 14. Pads (not shown) for connecting a gate line and a data line are respectively formed at the neighboring edges of the lower panel 14.

Output electrode patterns of TCPs 40 and 50 are respectively connected to the pads for connecting a data line and a gate line while input electrode patterns of TCPs 40 and 50 are connected to a gate-source integrated type drive FPC 60.

The gate-source integrated type drive FPC 60 includes a gate drive portion 61, a source drive portion 62, and a connector portion 63 for connecting them, and forms a single layer. Pads for connecting a gate drive IC are formed by a predetermined space at an edge of the gate drive portion 61 that faces the LCD panel. Pads for connecting a source drive IC are formed by a predetermined space at an edge of the source drive portion 62 that faces the LCD panel.

Figure 4:
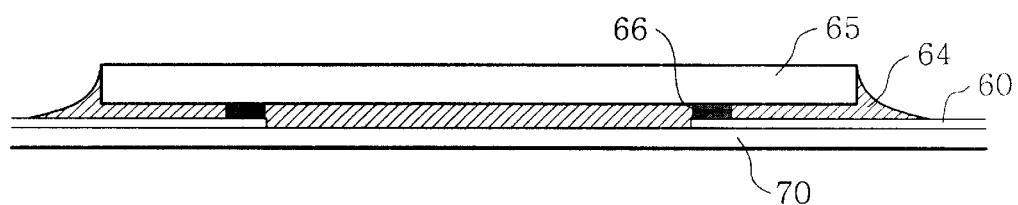
FIG. 4 is a section view of the flip chip bonding shown in FIG. 3.

The components to be mounted onto the gate-source integrated type drive FPC 60 are mounted by a flip-chip bonding method. Referring to FIG. 4, a part 65 mounted on the gate-source integrated type drive FPC 60 is connected to the patterns formed on the gate-source integrated type drive FPC 60 via a bump 66 and is encapsulated by a molding substance 64. Reference numeral 70 denotes a heat sink.

According to the LCD module of embodiment 2, the gate-source integrated type drive FPC is used so as to reduce the thickness of the gate portion and the source portion. Moreover, an overall weight can be further reduced.

In addition, an additional connector is not required since the gate and source portions are integrally formed by using the FPC. Thus, the manufacturing process can be simplified while reducing manufacturing costs.

Figure 5:
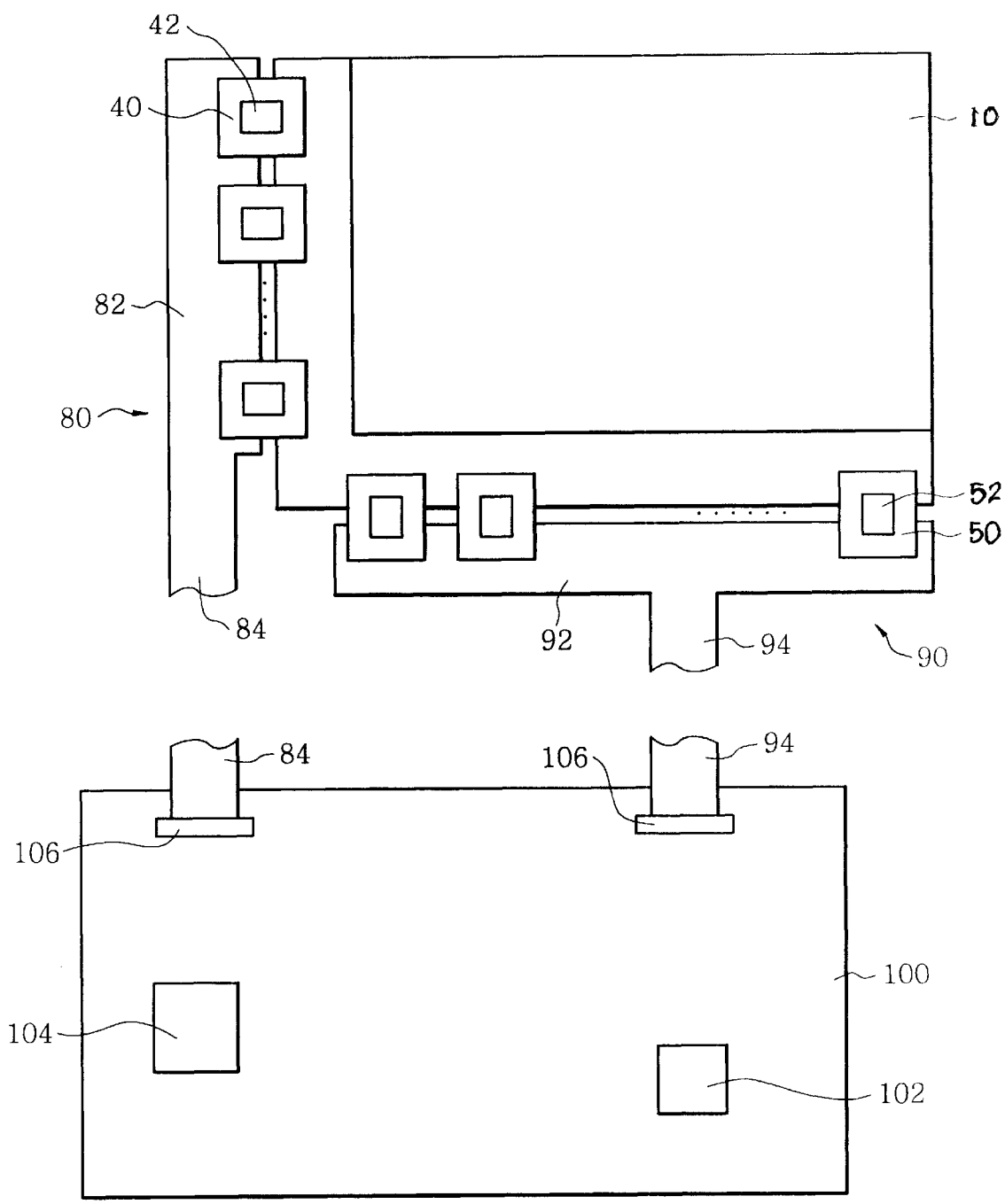
FIG. 5 shows a structure of an LCD module according to embodiment 3 of the present invention.

Now referring to FIG. 5, pads (not shown) for connecting a gate line and a data line are formed respectively on the neighboring edges of the LCD panel 10.

Output electrode patterns of the TCPs 40 and 50 are connected respectively to the pads for connecting a gate line and a data line while input electrode patterns of the TCPs 40 and 50 are connected respectively to a gate drive FPC 80 and a source drive FPC 90.

The gate drive FPC 80 includes a main body 82 and a gate drive connector portion 84 formed integrally with the main body 82, and forms a single layer. Pads for connecting a gate drive IC are formed by a predetermined space at an edge of the main body 82 that faces the LCD panel, and a pad (not shown) for connecting a graphic board is formed at an end portion of the gate drive connector portion 84.

A source drive FPC 90 includes a main body 92 and a source drive connector portion 94 formed integrally with the main body 92, and forms a single layer. Pads for connecting a source drive IC are formed by a predetermined space at an edge of the main body 92 which faces the LCD panel, and a pad (not shown) for connecting a graphic board is formed at an end portion of the source drive connector portion 94.

Figure 6:
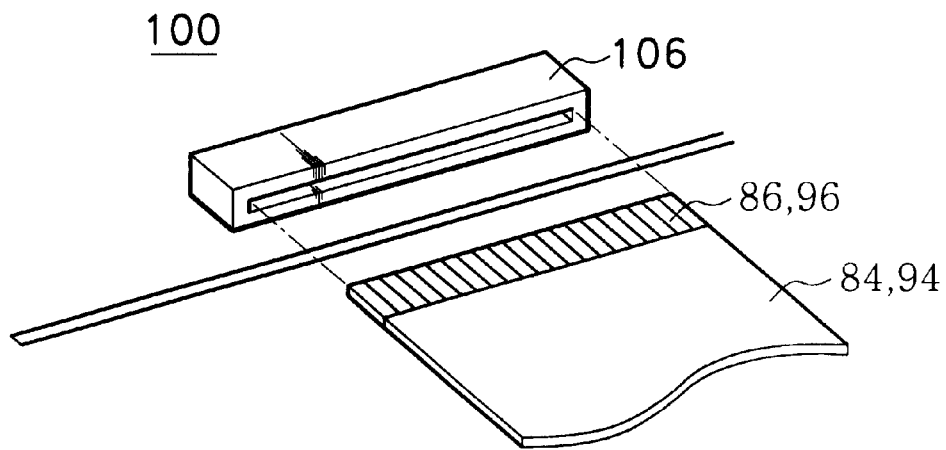
FIG. 6 shows a connection structure of the LCD module shown in FIG. 5.

Referring to FIG. 6, pads 86, 96 for connecting a graphic board are formed at end portions of the gate and source drive connector portions 84, 94, and are inserted into a terminal block 106 formed on a graphic board 100. Therefore, it is preferable to install the graphic board 100 to the portion of the main body of the LCD nearest to the LCD panel so that gate and source drive connector portions 84, 94 have the minimum length.

Reference numerals 102 and 104 denote interface ICs mounted onto the graphic board 100.

According to the present invention, components, e.g., an interface IC, are not mounted onto the gate and source drive FPCs 80 and 90, but are mounted onto the graphic board 100. The graphic signals compressed at the graphic board 100 pass through the interface ICs 102 and 104 and are transmitted to the source driving IC 52 via the source drive FPC 90. Then, the graphic signals are applied to a data line of the LCD panel 10. In addition, the signal generated from the interface ICs 102 and 104 and the gate on/off voltage are transmitted to the gate driving IC 42 via the gate drive FPC 80 and applied to a gate line of the LCD panel 10.

Thus, the gate and source drive FPCs 80 and 90 serve as a connector for simply connecting the graphic board 100 with the gate drive IC 42 and the source drive IC 52 on the TCPs 40 and 50, respectively.

As described above, the components, e.g., an interface IC, are mounted onto a graphic board so as to greatly reduce the thickness of the gate and source drive FPCs. Thus, a slim and lightweight LCD module can be obtained.

Another advantage of such a mounting is that the widely used chips, for example, an interface IC, can be easily integrated into a single chip, and a high frequency noise, for example, an electromagnetic interference, generated from the LCD module can be easily handled.

According to embodiment 1, the output electrode patterns of TCP having a driving IC are connected to the pads for connecting gate line and data line by thermocompression bonding while the input electrode patterns are respectively connected to the gate and source drive PCBs by thermocompression bonding. According to embodiments 2 and 3, the input electrode patterns of TCP are thermocompression bonded to the source drive FPC or to the gate-source integrated type drive FPC.

However, as described above, if the TCP is thermocompression bonded onto the gate or source drive PCB or onto the gate or source drive FPC, a misalignment may occur or the TCP may warp after the thermocompression bonding due to the difference between the heat expansion coefficients of the TCP and PCB or of the TCP and FPC. Thus, product's reliability with respect to assembly or impact may be harmed. Moreover, sizes of the gate or source drive PCB and the gate or source drive FPC become large as an LCD becomes large. As a result, the difference between the heat expansion coefficients of the TCP and PCB or of the TCP and FPC causes more problems. This is more serious at both edges of the PCB or FPC where the TCP is attached, than at the center.

In accordance with another aspect of the present invention, at least one separating slot is formed at the edge where the TCP is attached so that the size of the gate or source drive PCB or the gate or source drive FPC can be substantially decreased when the thermocompression bonding is performed.

Figure 7:
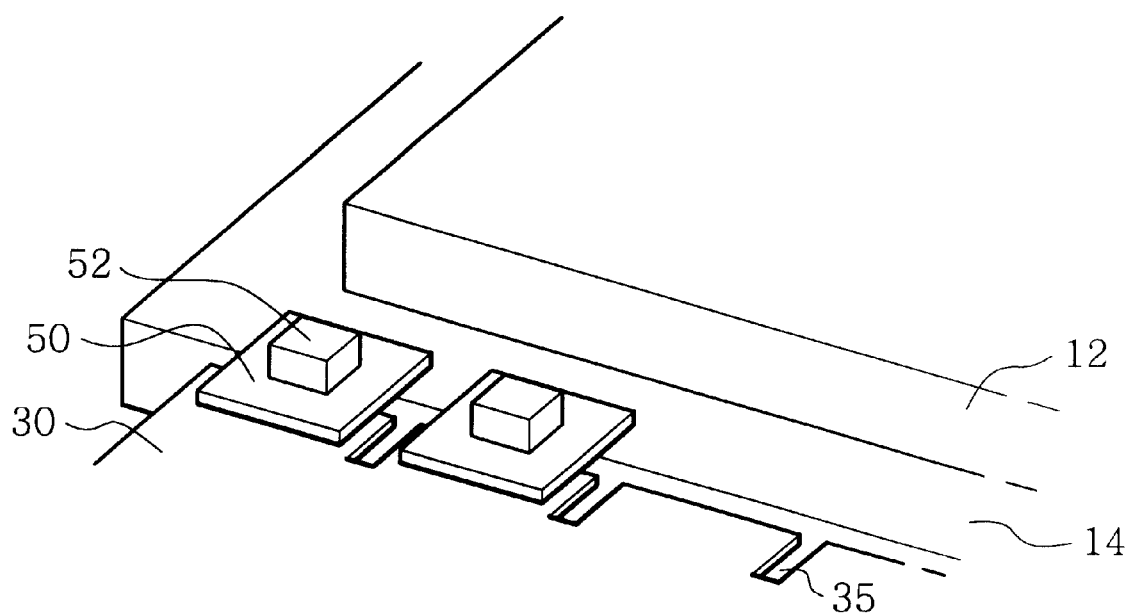
FIG. 7 is a perspective view showing a structure of the source drive portion of the present invention.

An embodiment where the source drive PCB and the TCP are interconnected is shown in FIG. 7. However, an embodiment where the gate drive PCB and the TCP are interconnected, or where the TCP and FPC are interconnected, is also allowable.

Referring to FIG. 7, the TCP 50 including the source drive IC 52 is installed in a fashion that the source drive PCB 30 is connected to the lower panel 14 of the LCD panel. Here, separating slots 35 are formed on the source drive PCB 30 between the TCPs 50.

Figure 8:
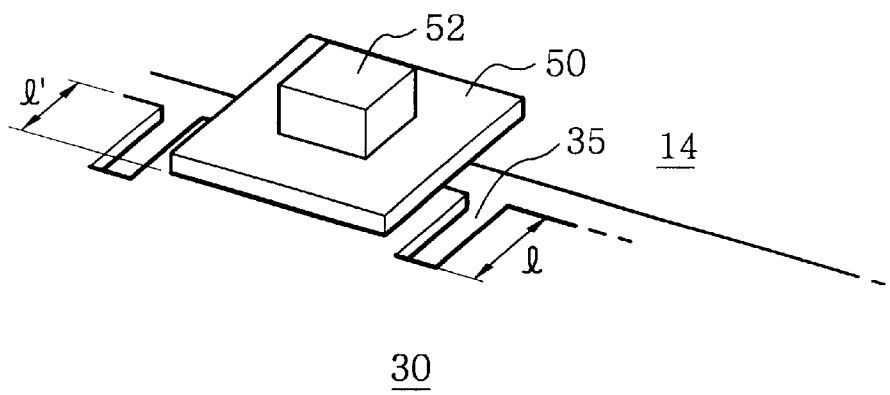
FIG. 8 is a partial perspective view of the structure of the source drive portion shown in FIG. 7.

Now referring to FIG. 8, the separating slot 35 is shaped as a recess which is cut by a predetermined length from the edge of the source drive PCB 30. Here, the cut length I is preferably longer than the length I' by which the TCP 50 is mounted onto the source drive PCB 30. This will be explained in more detail later.

A method for thermocompression bonding a TCP onto the source drive PCB having a separating slot will be explained with reference to FIG. 9.

Figure 9:
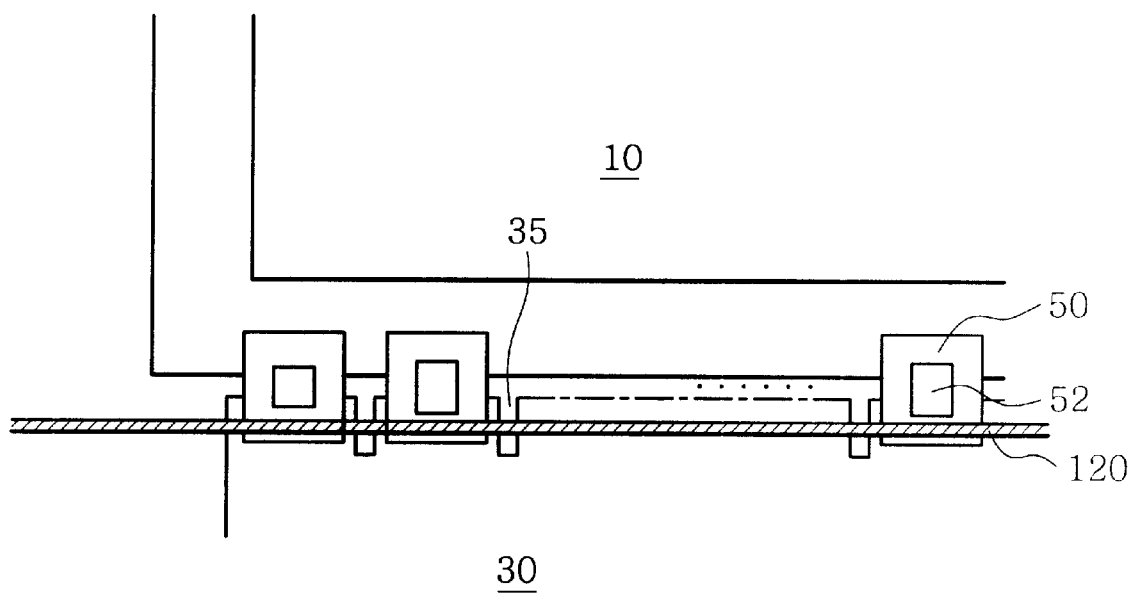
FIG. 9 shows a state where a thermocompression bonding method is applied to the structure shown in FIG. 7.

As shown in FIG. 9, the input electrode patterns of the TCP 50 are aligned onto the connector pad of the source drive PCB 30. Then, a heating bar 120 is thermocompression bonded onto the TCP 50 at a predetermined temperature, pressure, and for a predetermined time period.

At this time, the portions onto which the respective TCPs 50 are attached operate as an individual PCB with respect to the thermocompression molding of the heating bar 120 since the length of the separating slot 35 is longer than that by which the TCP 50 is mounted onto the source drive PCB 30.

The size of the source drive PCB 30 is substantially decreased by separating slots 35. Therefore, a difference between the coefficients of the heat expansions of the source drive PCB 30 and the TCP 50 becomes less. As a result, a misalignment or a warpage of the TCP can be prevented while enhancing the product's reliability with respect to assembly, vibration or impact.

In this embodiment, separating slots 35 are described as being corresponded to the respective TCPs 50. However, the number of separating slots can be varied in accordance with the temperature, pressure, or the thickness of the PCB at the time when the thermocompression molding is performed. That is, a single separating slot can be formed with respect to a plurality of TCPs in the center of the PCB where the degree of the expansion is low. In addition, separating slots can be assigned to each TCP at the edge of the PCB where the degree of the expansion is high.

It is important to control the position and number of the separating slots so that the difference between the degrees of the TCP and PCB may not deviate from the process margin of the TCP pad pitch.

Figure 10:
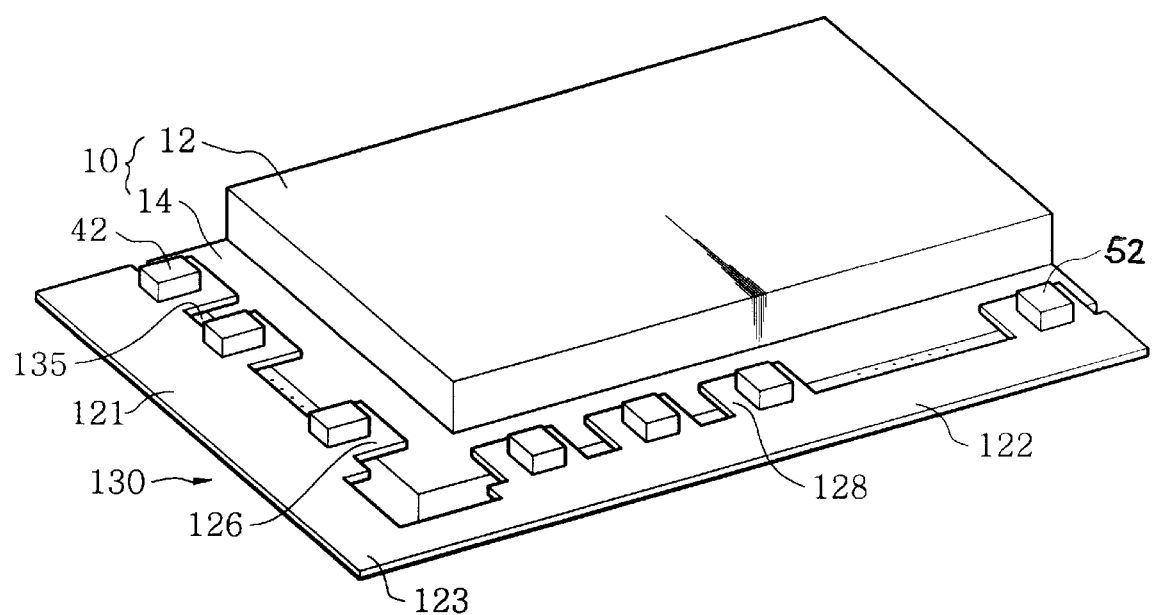
FIG. 10 is a perspective view of an LCD module according to embodiment 4 of the present invention.

Referring to FIG. 10, the LCD panel 10 includes the upper panel 12 and the lower panel 14 attached to the upper panel 12 by filling a crystal liquid between the upper and lower panels 12, 14. Pads (not shown) for respectively connecting a gate line and a data line are formed at the neighboring edges of the lower panel 14.

A gate-source integrated type drive FPC 130 includes a gate drive portion 121, a source drive portion 122, and a connector portion 123 for connecting them, and forms a single layer. Link portions 126 on which the gate drive IC is mounted are formed by a predetermined space at an edge of the gate drive portion 121 that faces the LCD panel, and link portions 128 on which the source drive IC is mounted are formed by a predetermined space at an edge of the source drive portion 122 which faces the LCD panel.

In this embodiment, link portions 126 and 128 of the gate-source integrated type drive FPC 130 are respectively linked to the pads for connecting a data line and a gate line.

Reference numerals 42 and 52 denote the gate and source drive ICs.

Using the flip-chip bonding method shown in FIG. 4, components are mounted onto the gate-source integrated type drive FPC 130, and the gate and source drive ICs are mounted onto the link portions 126 and 128.

Preferably, separating slots 35 are formed to link the link portions 126 and 128 with pads for connecting a data line and a gate line of the LCD panel 10. By employing such a structure, a misalignment that may occur when interconnecting FPC and LCD panel can be prevented.

According to embodiment 4 of the present invention, the gate-source integrated type drive FPC is used so as to reduce the thickness of the gate and source portions. In addition, an overall weight of the LCD module can be reduced.

The gate and source portions are formed integrally by employing the FPC, which eliminates the necessity of additional connector. As a result, manufacturing process is simplified while reducing manufacturing costs.

In addition, link portions that links the gate-source integrated type drive FPC with the LCD panel are formed integrally with the gate-source integrated type drive FPC, eliminating the necessity of additional TCP.

Moreover, a misalignment that may occur while linking the gate-source integrated type drive FPC to the LCD panel with a TCP can be prevented.

A structure where the gate and source drive FPCs are integrally formed is explained above, however, it is also allowable to apply a link portion integrated type drive FPC to either the source or gate.

Accordingly, the LCD module according to the present invention has the following benefits.

First, a gate drive FPC or a source drive FPC is used so as to reduce the thickness of the gate portion or the source portion, thus reducing an overall weight of the LCD module.

Second, a portion for interconnecting the gate drive FPC and the source drive FPC is integrated with both of the FPCs. Thus, an additional connector is not required, thereby simplifying manufacturing processes and reducing manufacturing costs.

Third, at least one separating slot is formed at the edge onto which the TCP is attached so that the size of the gate or source drive PCB and the size of the gate or source drive FPC can be substantially reduced when thermocompression bonding is performed.

Thus, a difference between the heat expansion coefficients of the source drive PCB and the TCP becomes less. As a result, a misalignment or a warpage of the TCP can be prevented while the product's reliability with respect to assembly, vibration or impact may be enhanced.

This invention has been described above with reference to the aforementioned embodiments. It is evident, however, that many alternative modifications and variations will be apparent to those having skills in the art in light of the foregoing description. Accordingly, the present invention embraces all such alternative modifications and variations as fall within the spirit and scope of the appended claims.

What is claimed is:

1. A liquid crystal display (LCD) module, comprising:

an LCD panel having an upper panel and a lower panel attached together with liquid crystal filled there between;

a source drive portion facing one of neighboring edges of the lower panel and connected to the lower panel by a tape carrier package (TCP) having a source driving integrated circuit (IC) thereon; and a gate drive portion facing the other neighboring edges of the lower panel, and connected to the lower panel by a TCP having a gate driving IC thereon, said gate drive portion being electrically connected to said source drive portion, wherein the TCPs are connected to said source drive portion and said gate drive portion by a thermocompression bonding, and said source drive portion and said gate drive portion substantially decrease the size of an area affected by the thermocompression bonding that attaches the TCPs to said source drive portion and said gate drive portion.

2. The LCD module according to claim 1, wherein said source drive portion and said gate drive portion decrease the size of the area by forming a separating slot at their edges facing the lower panel of said LCD panel.

3. The LCD module according to claim 2, wherein the separating slot has a length longer than the area where the TCPs are attached to said source drive portion and said gate drive portion.

4. The LCD module according to claim 2, wherein the separating slots are formed more densely at the edges of said source drive portion and said gate drive portion than at the center thereof.

5. The LCD module according to claim 1, wherein either said source drive portion or said gate drive portion is made up of an FPC.

6. A liquid crystal display (LCD) module, comprising:

an LCD panel having an upper panel and a lower panel attached together with liquid crystal filled therebetween;

a source drive portion facing one of neighboring edges of the lower panel and connected to the lower panel by an integrally formed first connector portion where a source driving integrated circuit (IC) is mounted; and a gate drive portion facing the other neighboring edges of the lower panel, and connected to the lower panel by an integrally formed second connector portion where a gate driving IC is mounted, wherein only one of said source drive portion and said gate drive portion is made up of a flexible printed circuit (FPC), and wherein the first connector portion and the second connector portion are separated into driving IC units by separating slots.

7. The LCD module according to claim 6, wherein said source drive portion and said gate drive portion are integrally formed.

* * * * *